(12) United States Patent
Eaton et al.

(10) Patent No.: US 8,150,091 B2
(45) Date of Patent: Apr. 3, 2012

(54) PRINTED CIRCUIT BOARD FOR A FLAT-PANEL SPEAKER

(75) Inventors: William Chris Eaton, Cary, NC (US); Eric Douglas Romesburg, Chapel Hill, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 1144 days.

(21) Appl. No.: 11/956,814

(22) Filed: Dec. 14, 2007

(65) Prior Publication Data

US 2009/0154756 A1 Jun. 18, 2009

(51) Int. Cl.
*H04R 1/02* (2006.01)
*H04R 31/00* (2006.01)

(52) U.S. Cl. ...... 381/386; 381/114; 381/116; 455/575.1

(58) Field of Classification Search ............... 381/332, 381/386, 111, 114, 116; 455/575.1
See application file for complete search history.

(56) References Cited

U.S. PATENT DOCUMENTS

| | | | |
|---|---|---|---|
| 3,892,930 A * | 7/1975 | Wieder | 340/629 |
| 3,975,076 A * | 8/1976 | Shida et al. | 439/62 |
| 4,198,601 A * | 4/1980 | Ono et al. | 455/73 |
| 4,963,098 A * | 10/1990 | Myer et al. | 439/76.1 |
| 5,768,369 A * | 6/1998 | Zoiss et al. | 379/433.03 |
| 5,974,655 A | 11/1999 | Lindman et al. | |
| 6,354,870 B1 * | 3/2002 | Timmerman | 439/569 |
| 6,389,145 B2 * | 5/2002 | Baumhauer et al. | 381/345 |
| 6,591,088 B1 * | 7/2003 | Watanabe | 455/90.3 |
| 6,842,964 B1 * | 1/2005 | Tucker et al. | 29/594 |
| 7,167,130 B2 | 1/2007 | Hayes | |
| 7,508,933 B2 * | 3/2009 | Yang | 379/433.02 |
| 2004/0142731 A1 * | 7/2004 | Ho et al. | 455/569.1 |
| 2005/0024273 A1 * | 2/2005 | Hayes | 343/702 |
| 2005/0067216 A1 * | 3/2005 | Schuhmann et al. | 181/149 |
| 2005/0129261 A1 | 6/2005 | Ito et al. | |
| 2005/0181841 A1 * | 8/2005 | Dou | 455/575.1 |
| 2005/0190941 A1 * | 9/2005 | Yang | 381/351 |
| 2009/0074226 A1 * | 3/2009 | Eaton et al. | 381/398 |
| 2009/0154756 A1 * | 6/2009 | Eaton et al. | 381/388 |
| 2009/0156273 A1 * | 6/2009 | Romesburg et al. | 455/575.3 |

FOREIGN PATENT DOCUMENTS

JP 2006279701 A 10/2006
KR 20050026139 A 3/2005

OTHER PUBLICATIONS

PCT—International Search Report dated Dec. 9, 2008, for Application No. PCT/US2008/069152, Filed Jul. 3, 2008.
Demuynck, Randolph Cary, "Electrostatic Speaker Arrangement for a Mobile Device," U.S. Appl. No. 11/956,367, filed Dec. 14, 2007.

* cited by examiner

*Primary Examiner* — Mary Wilczewski
(74) *Attorney, Agent, or Firm* — Coats & Bennett, P.L.L.C.

(57) ABSTRACT

A flat-panel speaker is attached to an exterior surface of a printed circuit board (PCB) housed within a consumer electronic device. Rather than place the flat-panel speaker within a sealed speaker box and then attach the speaker box to the PCB, as is conventional, the present invention attaches the flat-panel speaker to the exterior surface of the PCB without the speaker box. Removing the speaker box allows designers to reduce the dimensions of the device, and to minimize the complexity of the device.

15 Claims, 10 Drawing Sheets

PRINTED CIRCUIT BOARD FOR A FLAT-PANEL SPEAKER

FIELD OF THE INVENTION

The present invention relates generally to printed circuit boards, and particularly to printed circuit boards configured for use with flat-panel speakers.

BACKGROUND

Flat-panel speakers comprise a thin flexible panel element. Like conventional electrodynamic loudspeakers, flat-panel speakers convert electrical audio signals to audible sounds. However, electrodynamic speakers and flat-panel speakers generate and radiate sound energy in fundamentally different ways. Specifically, conventional electrodynamic loudspeakers have a coil attached to a diaphragm. Applying a voltage to the coil causes the diaphragm to vibrate back and forth to produce sound. Contrastingly, flat-panel speakers do not have a coil. Applying a voltage to a flat-panel speaker causes the panel element to distort or bend. With flat-panel speakers, these distortions produce acoustical sound waves.

Many consumer electronic devices that produce sound include flat-panel speakers. Wireless communication devices and audio players are some examples of devices that employ flat panel speakers. These devices typically house their flat-panel speakers within a speaker box. The speaker box, which is a sealed chamber placed within the interior of the device, helps prevent acoustic echo between the microphone and the speaker. However, devices using a speaker box need to be large enough to contain the speaker box. Additionally, speaker boxes must have connections to electrically connect the flat-panel speaker it houses to a driver circuit. As such, conventional devices may be larger and more complex than necessary.

SUMMARY

The present invention provides a consumer electronic device that addresses the size and complexity issues of the prior art. In one embodiment, the electronic device comprises a printed circuit board (PCB) within a housing. An audio port is formed in the housing through which a user hears audible sound. The PCB comprises one or more substrate layers having conductive traces to connect electronic components placed on the PCB. A flat-panel speaker, such as a piezoelectric speaker, mounts to an exterior surface of the PCB. Particularly, the flat-panel speaker attaches to the exterior surface of the PCB. One or more through-holes are formed within the interior of the PCB such that they extend through each of the one or more substrate layers and to an opposing exterior surface of the PCB. The through-holes are configured to direct audible sound through the PCB and to the user.

In another embodiment, an acoustic chamber comprising a space or volume may be formed adjacent the flat-panel speaker and the PCB. The acoustic chamber and the through-holes function to direct audible sound generated by the flat-panel speaker through the interior of the PCB to the audio port. In other embodiments, the acoustic chamber and/or the through-holes carry air displaced by the flat-panel speaker to the opposing side of the PCB.

Unlike conventional speaker arrangements, the present invention does not encase the flat-panel speaker within a sealed speaker box inside the housing. Instead, the present invention attaches the flat-panel speaker to the surface of the PCB. Attaching the flat-panel speaker in such a manner reduces the overall dimensions of the electronic device.

DETAILED DESCRIPTION

The present invention addresses size and performance issues associated with consumer electronic devices that produce audible sound. In one embodiment, a flat-panel speaker is attached to a printed circuit board (PCB) housed within the device. The flat-panel speaker may comprise, for example, a piezoelectric speaker that bends or distorts responsive to an applied voltage. However, rather than place the flat-panel speaker within a sealed speaker box and then attach the speaker box to the PCB, as is conventional, the present invention attaches the flat-panel speaker to a surface of the PCB without the speaker box. Removing the speaker box allows designers to reduce the dimensions of the device, and to minimize the complexity of the device.

Figures 1A, 1C:
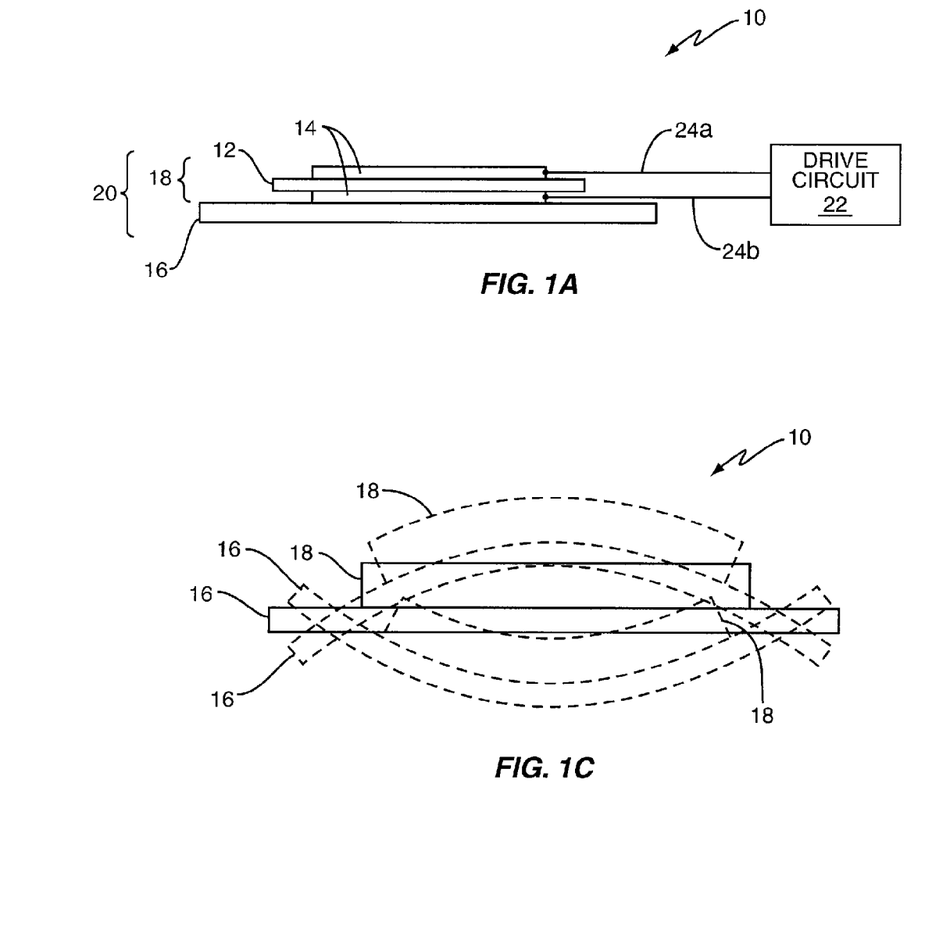
FIGS. 1A-1C illustrate a flat-panel speaker suitable for use in one embodiment of the present invention.
Figure 1B:
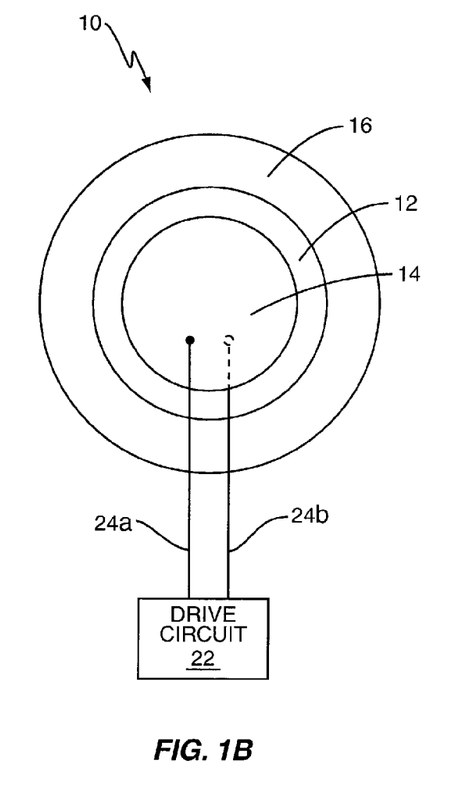

FIGS. 1A-1C illustrate one type of flat-panel speaker 10 suitable for use with the present invention. A flat-panel speaker is defined to comprise any substantially flat sound-producing loudspeaker that does not employ a coil to vibrate a sound-producing element. As seen in the figures and as described in the specification, the flat-panel speaker 10 comprises a piezoelectric speaker. One particularly suitable piezoelectric speaker, for example, is model number BX-070093 (Type-F) manufactured by MURATA Manufacturing Co., Ltd. However, the use of a piezoelectric speaker in the figures is for illustrative purposes only. In some embodiments, flat-panel speaker 10 comprises other types of speakers. Other flat-panel speakers 10 suitable for use with the present invention include, but are not limited to Distributed Mode Loudspeakers (DMLs), ribbon speakers, electrostatic speakers, and the like.

The structure and operation of piezoelectric speakers are well-known in the art; however, a brief description is included here for completeness. As seen in FIG. 1A (side view) and 1B (top view), flat-panel speaker 10 comprises a piezoelectric ceramic plate 12 sandwiched between a pair of electrodes 14. The ceramic plate 12 and the electrodes 14 form a piezoelectric element 18 that binds to a metallic base plate 16 using any of a variety of adhesives known in the art. Typically, base plate 16 is constructed of brass or stainless steel, but other metals or alloys may also be suitable. Together, the ceramic plate 12, the electrodes 14, and the base plate 16 comprise a piezoelectric diaphragm 20.

A drive circuit 22 attaches to the electrodes 14 on both sides of the ceramic plate 12 via lead wires 24a, 24b. In operation, the drive circuit 22 delivers a voltage representing an audio signal to the electrodes 14. This voltage causes the piezoelectric element 18 to expand and shrink. When the piezoelectric element 18 expands or shrinks, the piezoelectric diaphragm 20 bends as shown in FIG. 1C. Repeatedly applying the voltage to the electrodes 14 thereby causes the piezoelectric diaphragm 20 to oscillate and produce the audible sound waves heard by a user.

Figure 2:
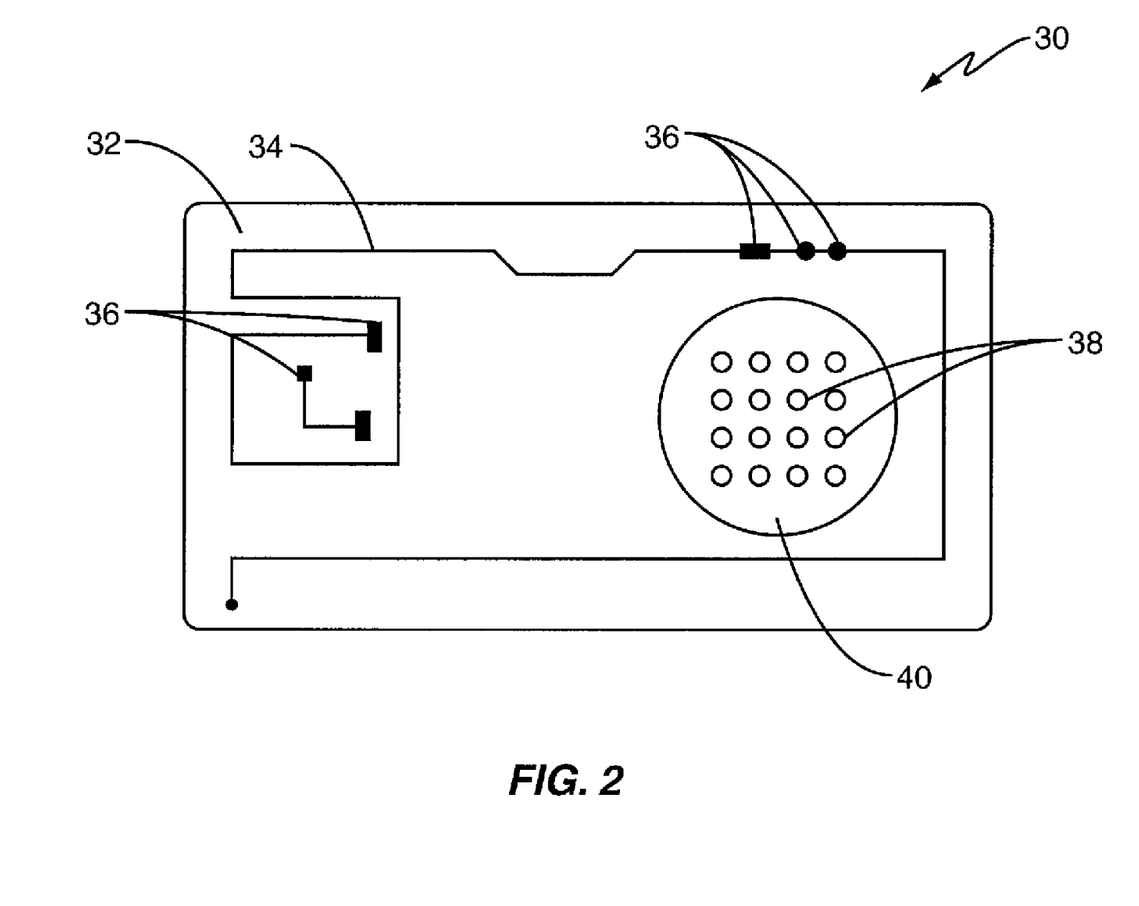
FIG. 2 illustrates a printed circuit board (PCB) suitable for use in one embodiment of the present invention.

FIG. 2 illustrates a printed circuit board (PCB) 30 suitable for use with the present invention. As seen in FIG. 2, PCB 30 comprises one or more substrate layers 32. Substrate layers 32 are dielectric layers that may be constructed, for example, from a fiberglass reinforced epoxy material. However, any rigid or flexible material used to construct PCB 30 is suitable for the purposes of the present invention.

Each of the substrate layers 32 may include one or more conductive traces 34. The traces 34 may be formed by any of a number of well-known processes, such as "etching," for example. With etching, sheets of conductive foil, such as copper, are affixed to the sides of substrate layers 32. Chemicals or lasers are then employed to "etch" the substrate layers 32 and remove unwanted copper. The copper remaining on the substrate layers 32 form the conductive traces 34.

Conductive traces 34 conduct electrical signals to and from various electrical components 36 soldered or otherwise connected to PCB 30. For example, the components may be connected to PCB 30 using a technology known as surface mount technology (SMT) in which surface mounted devices (SMD) are placed on conductive pads of PCB 30. The conductive pads may be coated with a thin layer of a temporary adhesive, such as solder paste, to hold the SMDs in place. The PCB 30 and the SMDs are then placed in a convection oven to melt the solder and connect the SMD to the PCB 30. The PCB 30 is then allowed to cool, which solidifies the solder and affixes the SMDs to PCB 30.

In some embodiments, PCB 30 may also include an acoustic chamber 40 that functions to help the flat-panel speaker 10 generate clear audible sound. Generally, acoustic chamber 40 comprises a space or volume that is adjacent the flat-panel speaker 10 and the PCB 30. By way of example, the acoustic chamber 40 may be between the flat-panel speaker 10 and the PCB 30. As seen in more detail below, acoustic chamber 40 may be formed as a recess in which all or a part of the recess extends at least partially through the interior of the substrate layers 32. In other embodiments, however, acoustic chamber 40 is formed as a space or volume in which all or part of the acoustic chamber 40 is positioned above a surface of PCB 30.

PCB 30 also includes one or more channels 38 adjacent the flat-panel speaker 10, PCB 30 and the acoustic chamber 40. The channels 38 are typically formed as one or more through-holes extending through the interior of PCB 30. As seen below, the channels 38 connect the acoustic chamber 40 to an opposing side of PCB 30. Both the acoustic chamber 40 and the one or more channels 38 are substantially aligned with the piezoelectric diaphragm 20 when the flat-panel speaker 10 is attached to the surface of PCB 30.

As previously stated, conventional electronic devices mount a electrodynamic speaker in a sealed speaker box, and then mount the speaker box on the inside of the device. Functionally, speaker boxes reduce the cancellation of sound waves generated by the speaker thereby providing a clearer sound. However, the inclusion of the speaker boxes within an electronic device necessarily increases the dimensions of the device. Further, most speaker boxes include circuitry that either drives the speaker, or connects the speaker to the circuits that drive it.

Additionally, the volume within a speaker box must be sufficiently large to handle the back-and-forth movement of the diaphragm. Particularly, the volume of air behind the speaker serves to add compliance. This permits movement of the diaphragm and lowers the resonant frequency of the system. Too little air means too little compliance. This may diminish sound quality by reducing the bandwidth and loudness of the speaker, and potentially increase distortion by interfering with the normal movement of the diaphragm. The present invention addresses these issues by removing the speaker box, and by employing a flat-panel speaker to generate sound in lieu of a electrodynamic speaker. This allows an overall reduction in the dimensions of an electronic device, and also minimizes the complexity of the device.

Figure 3:
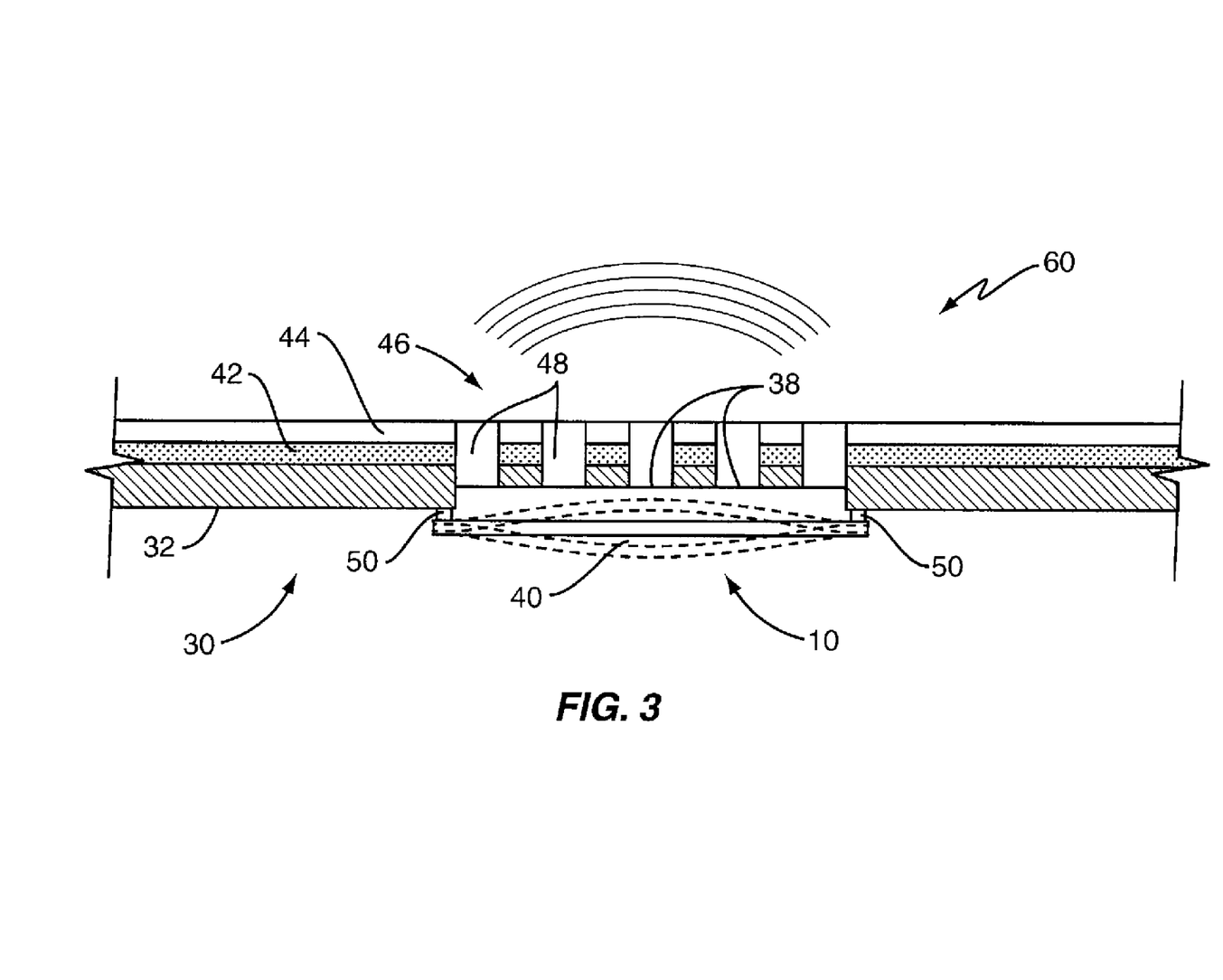
FIG. 3 is a sectional view of a consumer electronic device configured according to one embodiment of the present invention.

FIG. 3 illustrates a cross-section of an interior of a cellular telephone 60 configured according to one embodiment of the present invention. In FIG. 3, cellular telephone 60 comprises PCB 30, an intermediate layer 42, which may be a keypad circuit, for example, and an outer housing 44. The housing 44 includes an integrally formed audio port 46 comprising one or more openings 48 to project audible sound.

In this embodiment, the acoustic chamber 40 is formed as a recessed space extending partially into the interior of PCB 30. Particularly, acoustic chamber 40 extends through one or more substrates layers 32 and is sized such that it may receive at least part of the flat-panel speaker 10 when it oscillates to generate audible sound. The acoustic channels 38 also extend through one or more substrates layers 32 to connect the acoustic chamber 40 to audio port 46. Generally, the acoustic channels 38 align with corresponding holes in the intermediate layer 42 and with the corresponding openings 48 in housing 44. Flat-panel speaker 10 is attached to an opposing surface of the PCB 30, and oscillates as previously described to generate the audible sound. The generated sound travels through the acoustic chamber 40 and channels 38 to the openings 48. From there, the sound projects from the audio port 46 to the user of device 60.

Attaching the flat-panel speaker 10 to the exterior surface of PCB 30 may be accomplished using any means known in the art. For example, solder may be used to directly affix the base plate 16 to the surface of PCB 30. Alternatively, an adhesive tape or other adhesive compound is equally as suitable to attach base plate 16 to the surface of PCB 30. In this embodiment, however, gasket 50 adheres the base plate 16 of diaphragm 20 directly to the surface of PCB 30. The gasket 50 also functions to acoustically seal the flat-panel speaker 10 to the surface of PCB 30 to prevent the generated sound waves from leaking into adjacent areas of the housing 44.

Figure 4:
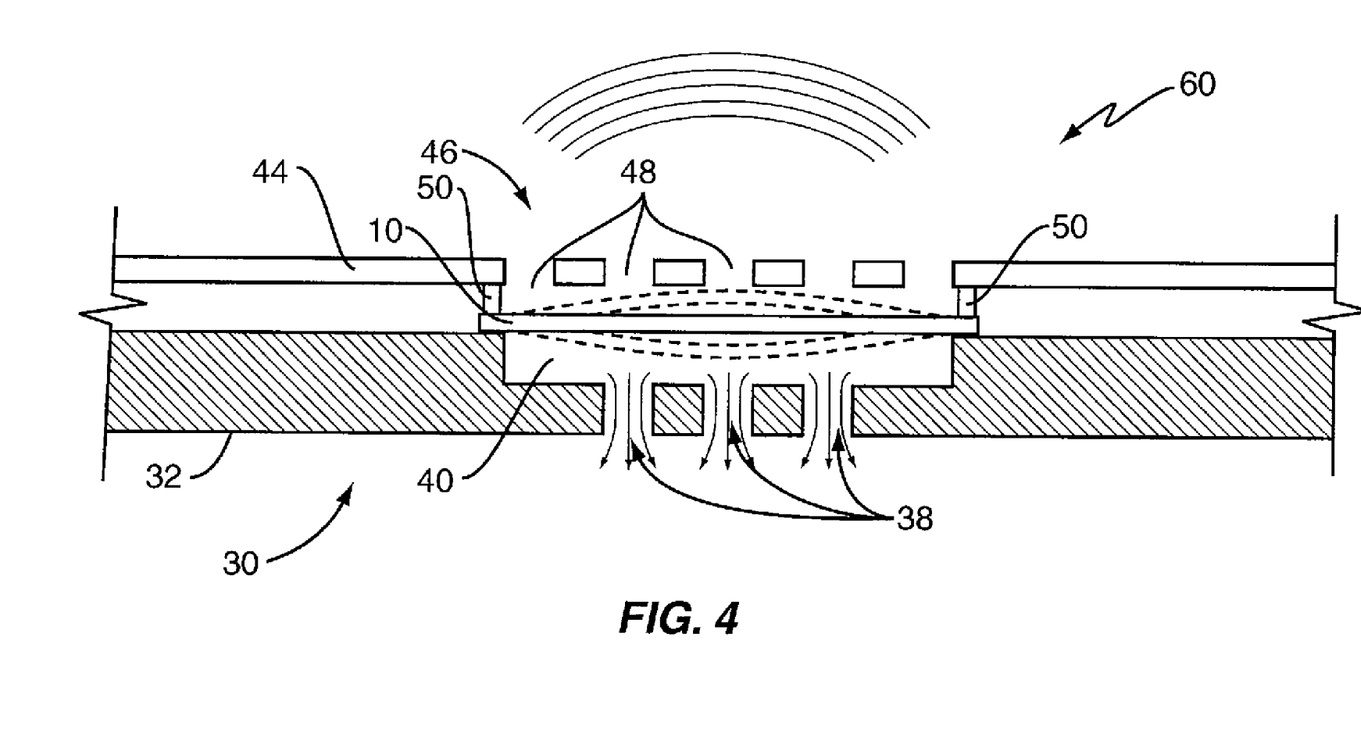
FIG. 4 is a sectional view of a consumer electronic device configured according to another embodiment of the present invention.

FIG. 4 illustrates cellular telephone 60 configured according to another embodiment of the present invention. In this embodiment, flat-panel speaker 10 is placed on the exterior surface of PCB 30 such that flat-panel speaker 10 is sandwiched between PCB 30 and the housing 44. Solder or some other suitable adhesive is used to affix the base plate 16 to the exterior surface of PCB 30, while gasket 50 attaches the base plate 16 to the interior part of the housing 44. As above, gasket 50 also functions to acoustically seal the flat-panel speaker 10 to prevent audible sound from leaking into adjacent areas of the interior of cellular telephone 60. Audible sound generated by flat-panel speaker 10 is therefore provided directly to audio port 46 where it exits the housing 44 through the openings 48.

Additionally, the acoustic chamber 40 comprises a recessed volume that extends at least partially through the interior of PCB 30 and aligns with the openings 48 in audio port 46. The channels 38 also extend through the interior of PCB 30 to connect acoustic chamber 40 to the opposite side of PCB 30. As above, the acoustic chamber 40 is sized to receive at least a part of the piezoelectric diaphragm 20 whenever it bends or distorts to generate sound. As the piezoelectric diaphragm 20 bends, the channels 38 allow the air in the acoustic chamber 40 to freely communicate with the air outside of acoustic chamber 40 thereby permitting loudspeaker audio.

Figure 5:
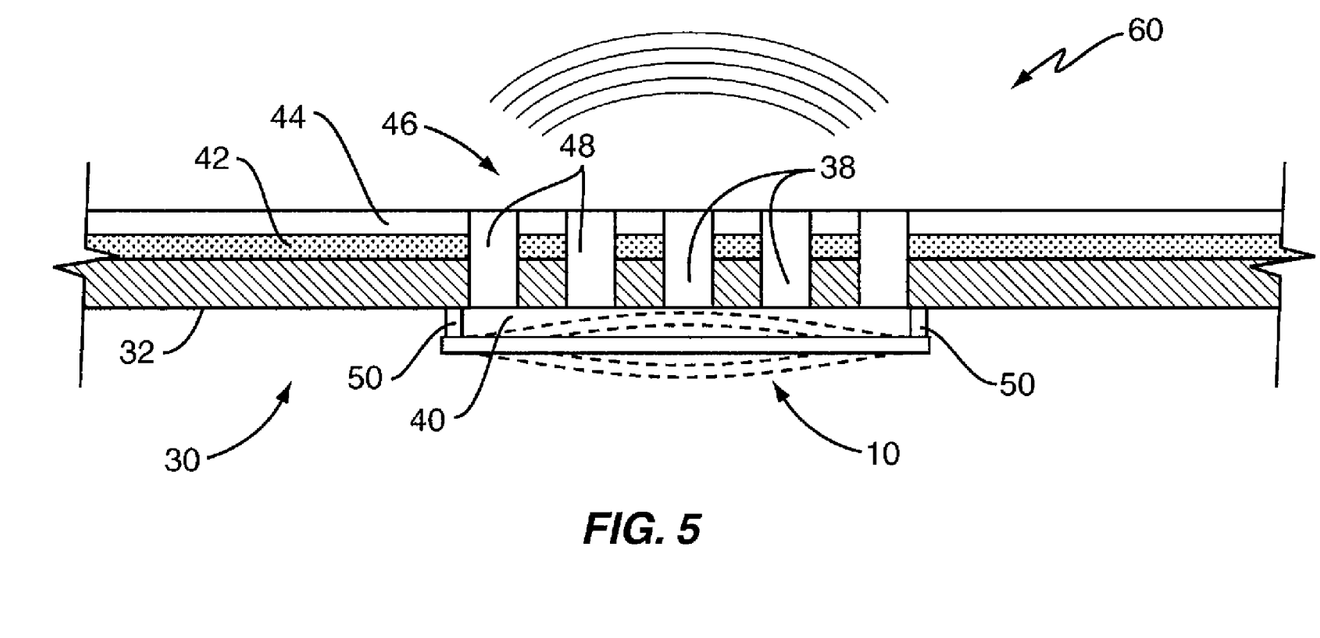
FIG. 5 is a sectional view of a consumer electronic device configured according to another embodiment of the present invention.
Figure 6:
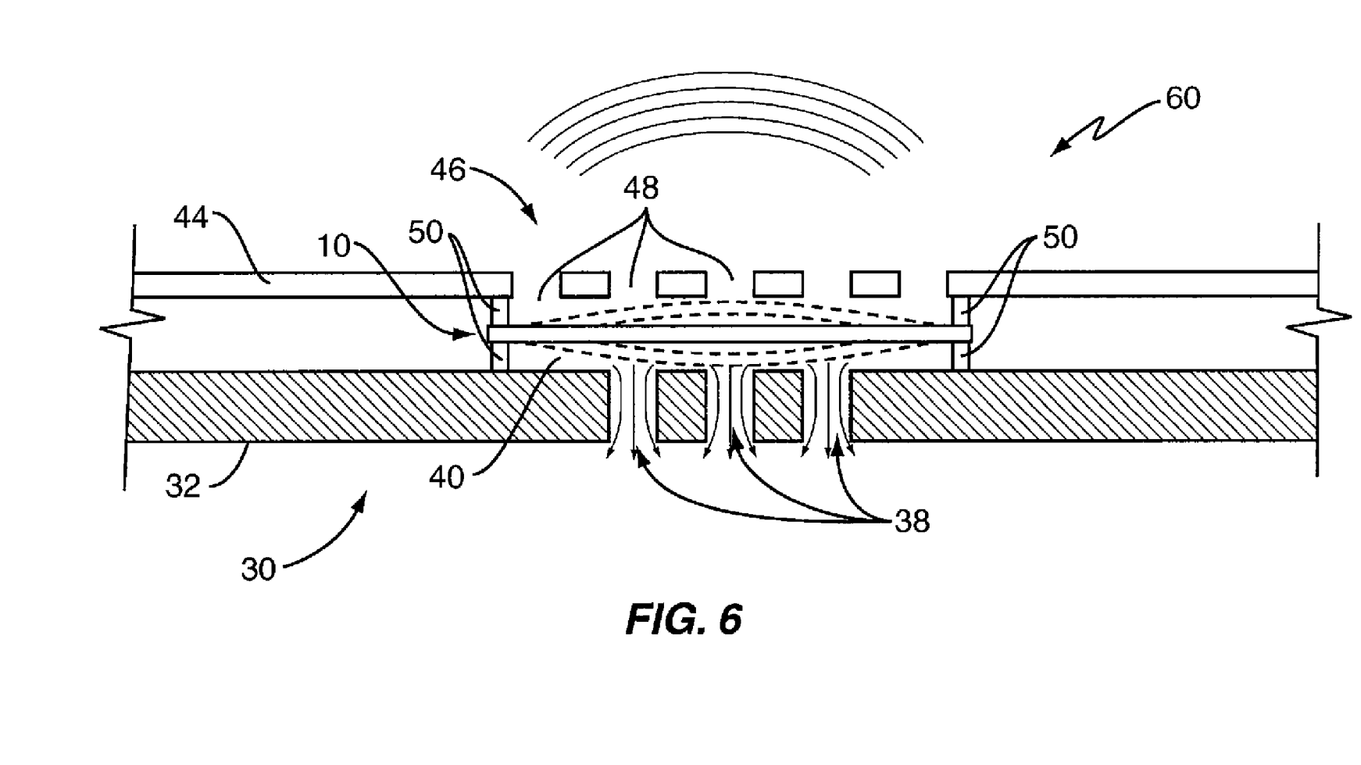
FIG. 6 is a sectional view of a consumer electronic device configured according to another embodiment of the present invention.

As previously stated, acoustic chamber 40 may be formed in any of a number of ways. The previous embodiments illustrate acoustic chamber 40 as being a recessed space integrally formed with PCB 30 in which all or part of the space extends into the interior of the PCB 30. However, FIGS. 5 and 6 illustrate alternate embodiments wherein all or part of the acoustic chamber 40 is formed as a space that lies above a surface of PCB 30. In FIG. 5, a gasket 50 is used to adhere the periphery of base plate 16 to the surface of PCB 30. In FIG. 6, first and second gaskets 50 may be used to adhere the periphery of base plate 16 to the inner surface of housing 44 and to the surface of PCB 30, respectively. In these embodiments, the gaskets 50 offset the flat-panel speaker 10 away from the surface of PCB 30 to create the acoustic chamber 40, and acoustically seal the flat-panel speaker to the PCB 30 to prevent the generated sound from leaking into the housing 44. The gaskets 50 preferably offset the flat-panel speaker a sufficient distance from the PCB 30 and/or housing 44 such that at least a portion of flat-panel speaker 10 may flex into the acoustic chamber 40. As in the previous embodiments, channels 38 carry audible sound through PCB 30 to the audio port 46 and/or allow acoustic pressure waves to travel through the PCB 30.

Figure 7:
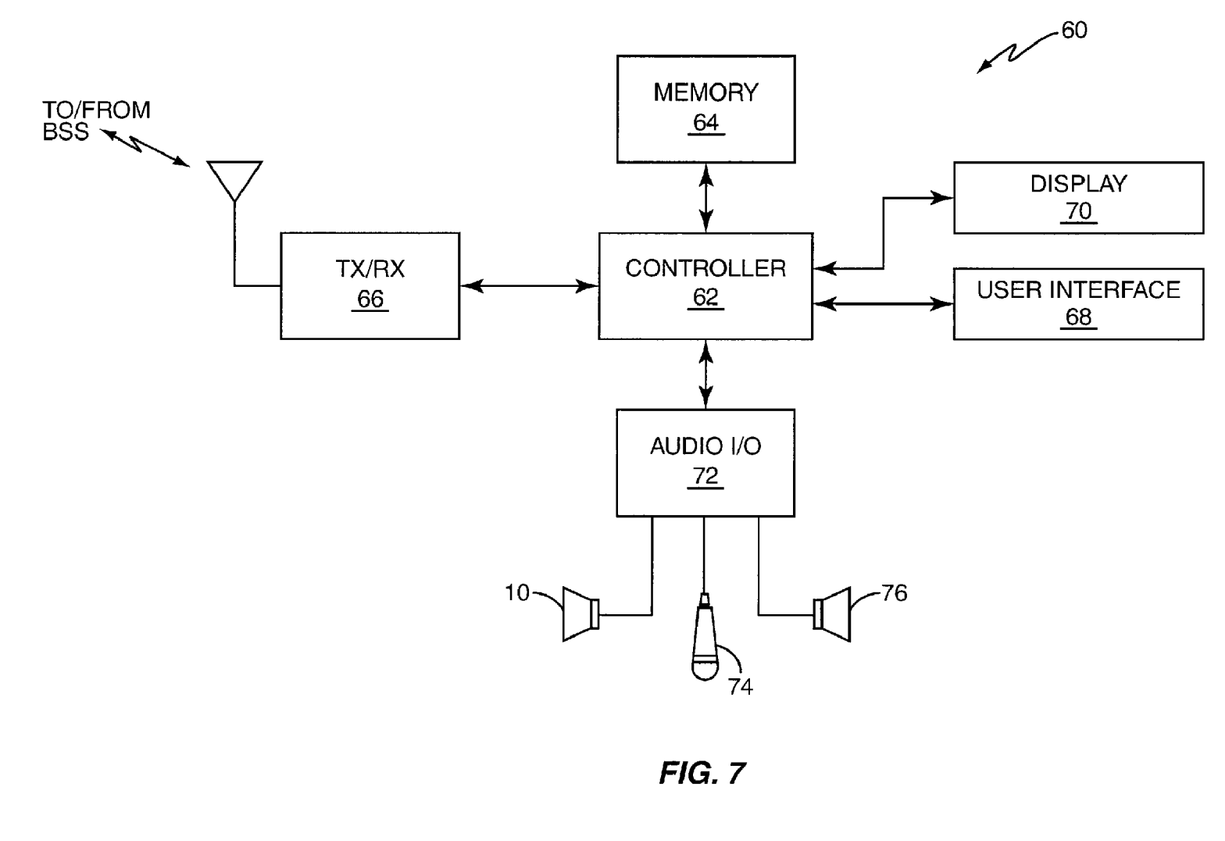
FIG. 7 illustrates a PCB formed according to one embodiment of the present invention.

FIG. 7 is a block diagram illustrating an exemplary cellular telephone 60 configured according to one embodiment of the present invention. The cellular telephone 60 comprises a main controller 62 to control the overall operation of the cellular telephone 60 and to execute user applications. Memory 64 stores those applications, system data needed for operation, and user data. The cellular telephone 60 further includes one or more communication interfaces 66 for communicating with remote devices over various communication networks. The communication interfaces 66 may include, for example, a conventional cellular transceiver. The cellular transceiver may use any known access technology, including, but not limited to, General Packet Radio Service (GPRS), Wideband Code Division Multiple Access (WCDMA), and Orthogonal Frequency-Division Multiplexing (OFDM).

The cellular telephone 60 further comprises a user interface 68 and a display 70. Display 70 outputs information for viewing by the user and the input devices 68 receive the user's input. The input devices 68 may comprise, for example, a keyboard, keypad, scroll wheel, touch pad, trackball, or other suitable user input device. A touch screen display may also be used as an input device 70.

Cellular telephone 60 also includes an audio processing unit 72 that processes audio signals. Specifically, a microphone 74 converts audible sounds into audio data for input to the audio processing unit 72. Those signals may then be sent to one or more remote parties via communication interface 66. Likewise, a speaker 76 converts audio signals output by the audio processing unit 72 into audible sound that the user can hear. Speaker 76 may, for example, be an earpiece speaker used to render audio from voice signals received from remote parties.

The audio processing unit 72 also provides audio signals to flat-panel speaker 10. As stated above, the flat-panel speaker 10 attaches to the surface of PCB 30 and generates audible sound for the user. In this embodiment, the flat-panel speaker 10 comprises a piezoelectric speaker that is used for rendering alert tones and music through audio port 48. The flat-panel speaker 10 may be placed in cellular telephone 10 such that the flat-panel speaker 10 is distanced away from the earpiece speaker 76. For example, in clamshell-type cellular telephones, the earpiece speaker 76 would typically be positioned in the "flip" of the device, while the flat-panel speaker 10 would be positioned in the base portion of the device. However, those skilled in the art will appreciate that this is not limiting, and that flat-panel speaker 10 is not limited in its placement or its function within cellular telephone 60.

Figure 8:
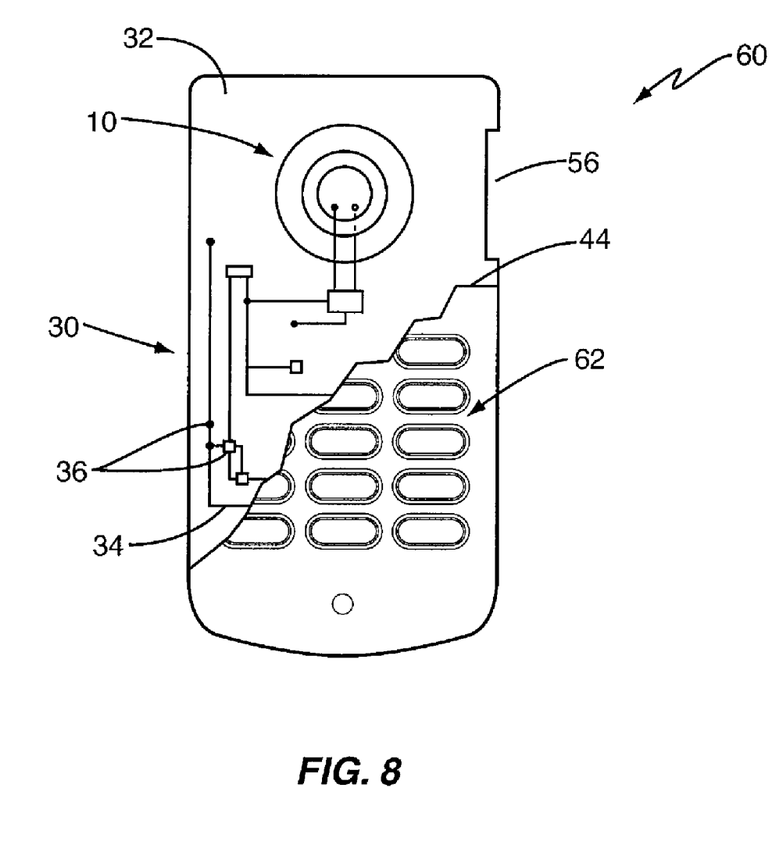
FIG. 8 is a block diagram illustrating a cellular telephone configured according to one embodiment of the present invention.

FIG. 8 illustrates a cutaway view of a base portion of cellular telephone 60 showing the flat-panel speaker 10 between PCB 30 and the housing 44. In this embodiment, a notch 56 is formed in a peripheral edge of PCB 30. Notch 56 may be used in addition to, or in lieu of, the one or more channels 38 to allow air to move throughout the interior of housing 44 when the flat-panel speaker 10 generates audible sound. Allowing the air to move may help to extend the frequency response of flat-panel speaker 10.

Figure 9:
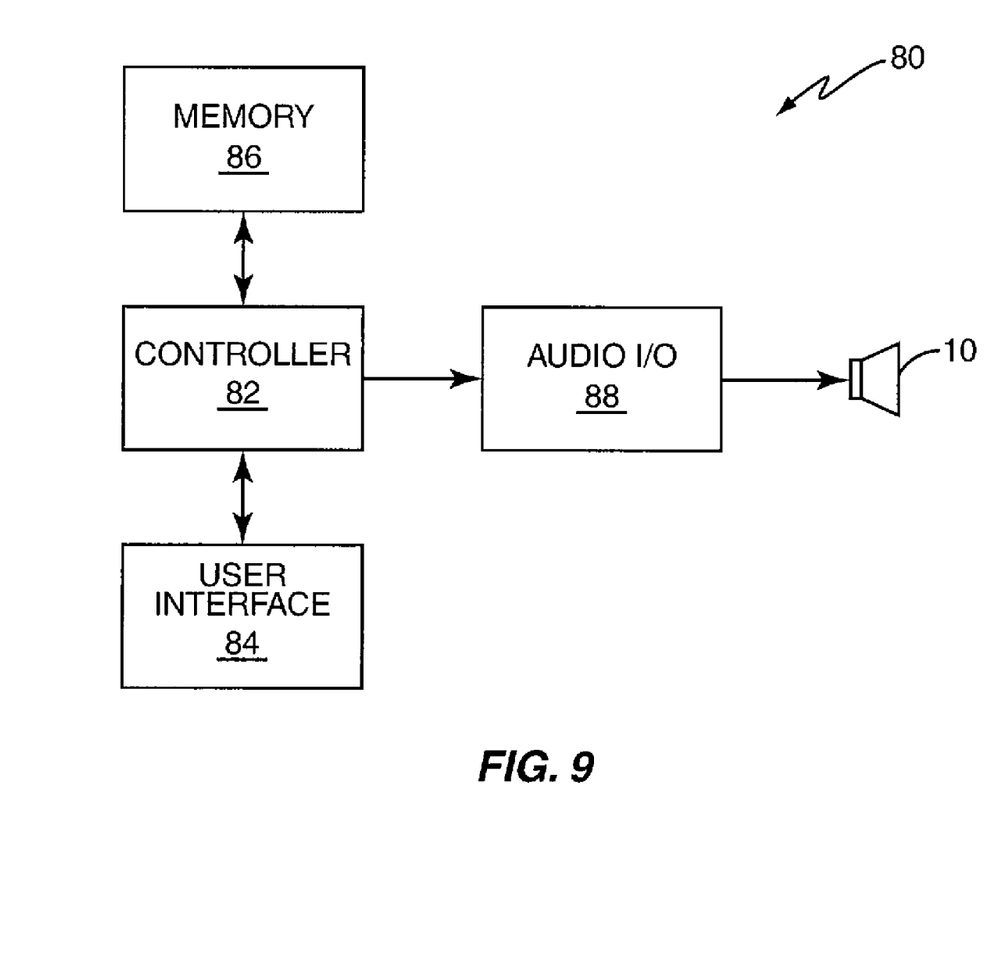
FIG. 9 is a block diagram illustrating an audio playback device configured according to one embodiment of the present invention.

FIG. 9 illustrates another type of electronic device suitable for use with the present invention. Specifically, FIG. 7 illustrates an audio player that renders music to a user. Audio player 80 comprises a controller 82, a user interface, 84, memory 86 to store music, and an audio I/O circuit 88. The controller 82 controls the operation of the audio player 80 according to programs and instructions stored in memory 86. A user may enter commands and select songs stored in memory 86 via user interface 84. The audio I/O circuit 88 processes the selected songs, and renders them to the user via flat-panel speaker 10. As above, audio player 80 includes the flat-panel speaker 10 on the surface of a PCB 30 without a sealed speaker box.

Figure 10:
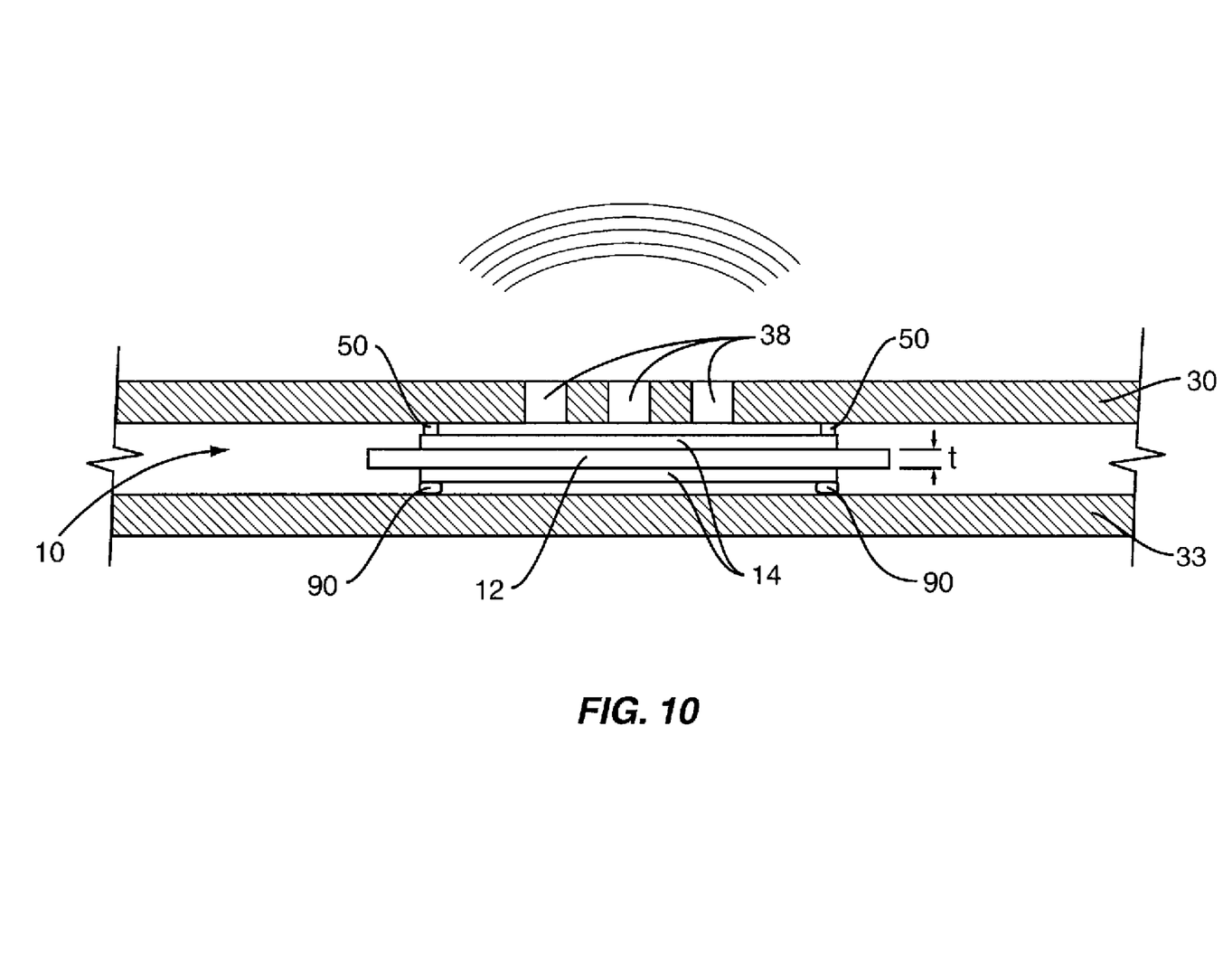
FIG. 10 illustrates another type of flat-panel speaker that is suitable for use in one embodiment of the present invention.

FIG. 10 is a side view illustrating another embodiment of the present invention. As seen in FIG. 10, the flat-panel speaker 10 is placed between a pair of rigid PCBs 30, 33. A gasket 50 adheres the flat-panel speaker 10 to an exterior surface of PCB 30, and acoustically seals the flat-panel speaker 10 to PCB 30. Solder offsets 90 attach the flat-panel speaker 10 to an exterior surface of PCB 33. Each PCB 30, 33 may comprise one or more substrate layers and electrical traces to electrically connect the electrical components mounted thereon. One of the PCBs, PCB 30, includes one or more through-holes 38 formed through the substrate layers. The through-holes 38 extend between the opposing exterior surfaces of the PCB 30. As in the previous embodiments, the drive circuit 22 attaches to the electrodes 14 on both sides of the ceramic plate 12. However, in this embodiment, audible sound is created with the changing thickness t of ceramic plate 12.

Particularly, the drive circuit 22 delivers a voltage representing an audio signal to the electrodes 14. This voltage causes the ceramic plate 12 to expand and shrink such that the thickness t of the ceramic plate 12 increases and decreases. This increase and decrease in the thickness t of the ceramic plate 12 produces the audible sound waves. The sound waves then travel through the through-holes 38 and to the audio port for output to the user.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A printed circuit board (PCB) for a consumer electronic device, the PCB comprising:
   one or more substrate layers having a conductive trace connecting one or more electronic components;
   a flat-panel speaker mounted to an exterior surface of the PCB, and comprising a flat-panel element configured to produce audible sound;
   an acoustic chamber disposed adjacent the flat-panel element, and comprising a volume formed as a recess in a first exterior surface of the PCB extending at least partially into the interior of the one or more substrate layers; and
   one or more through-holes formed in the one or more substrate layers and extending through the interior of the PCB to an opposing exterior surface of the PCB, the one or more through-holes acoustically connecting the acoustic chamber to the opposing exterior surface of the PCB.

2. The printed circuit board of claim 1 wherein the flat-panel speaker includes a base, and further comprising a gasket configured to attach a periphery of the base to the first exterior surface of the PCB, and to acoustically seal the flat-panel speaker to the first exterior surface of the PCB.

3. The printed circuit board of claim 1 wherein the acoustic chamber is sized to receive at least a portion of the flat-panel element when the flat-panel element flexes to produce the audible sound.

4. The printed circuit board of claim 3 wherein the volume further extends at least partially above the exterior surface of the one or more substrate layers.

5. The printed circuit board of claim 1 further comprising a cutout formed on a peripheral edge of the one or more substrate layers to extend a frequency response of the flat-panel speaker.

6. A consumer electronic device comprising:
   a housing;
   an audio port formed in the housing and configured to output audible sound;
   a printed circuit board (PCB) within the housing having a conductive trace connecting one or more electronic components;
   a flat-panel speaker mounted to an exterior surface of the PCB, and comprising a flat-panel element configured to generate the audible sound output through the audio port;
   an acoustic chamber disposed adjacent the flat-panel element, and comprising a volume formed as a recess in a first exterior surface of the PCB extending at least partially into the interior of the PCB; and
   one or more through-holes formed adjacent the flat-panel element and extending through the interior of the PCB to an opposing exterior surface of the PCB, the one or more through-holes acoustically connecting the acoustic chamber to the opposing exterior surface of the PCB.

7. The device of claim 6 wherein the flat-panel speaker comprises a base, and wherein the device further comprises a first gasket configured to attach a periphery of a first side of the base to the first exterior surface of the PCB.

8. The device of claim 7 further comprising a second gasket configured to attach a periphery of a second opposing side of the base to an interior surface of the housing.

9. The device of claim 6 wherein the acoustic chamber is sized to receive at least a portion of the flat-panel element when the flat-panel element flexes to generate the audible sound.

10. The device of claim 6 wherein the one or more through-holes are configured to communicate the audible sound generated by the flat-panel element through the interior of the PCB to the audio port.

11. The device of claim 6 wherein the one or more through-holes are configured to communicate air displaced from the acoustic chamber to the opposing side of the PCB.

12. The device of claim 6 further comprising a second audio port formed in the housing and spaced away from the first audio port, and an earpiece speaker configured to output audible sound through the second audio port.

13. A method of outputting audible sound to a user of a consumer electronic device, the method comprising:
   mounting a printed circuit board (PCB) in an interior of a housing of a consumer electronic device;
   mounting a flat-panel speaker to an exterior surface of the PCB;
   forming an acoustic chamber adjacent the flat-panel speaker and the PCB, the acoustic chamber comprising a volume formed as a recess in a first exterior surface of the PCB extending at least partially into the interior of the PCB;
   forming one or more through-holes adjacent the flat-panel speaker and through an interior of the PCB to an opposing exterior surface of the PCB to acoustically connect the acoustic chamber to the opposing exterior surface of the PCB;
   applying a voltage to the flat-panel speaker to generate audible sound; and
   outputting the audible sound from an audio port formed in the housing.

14. The method of claim 13 wherein mounting the flat-panel speaker to the first exterior surface of the PCB comprises adhering a periphery of a first side of the flat-panel speaker to the first exterior surface of the PCB to acoustically seal the flat-panel speaker to the PCB.

15. The method of claim 14 wherein mounting the flat-panel speaker to the first exterior surface of the PCB further comprises adhering a periphery of a second opposing side of the flat-panel speaker to an interior surface of the housing to acoustically seal the flat-panel speaker to the housing.

* * * * *